United States Patent
Chen

(10) Patent No.: US 9,709,799 B2
(45) Date of Patent: Jul. 18, 2017

(54) ELECTROWETTING DISPLAY PANEL, FABRICATION METHOD THEREOF AND DISPLAY APPARATUS COMPRISING THE SAME

(71) Applicant: BOE TECHNOLOGY GROUP CO., LTD., Beijing (CN)

(72) Inventor: Juan Chen, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 83 days.

(21) Appl. No.: 14/528,287

(22) Filed: Oct. 30, 2014

(65) Prior Publication Data

US 2015/0331231 A1 Nov. 19, 2015

(30) Foreign Application Priority Data

May 19, 2014 (CN) .......................... 2014 1 0211434

(51) Int. Cl.
*G02B 26/00* (2006.01)
*G02B 1/06* (2006.01)
(Continued)

(52) U.S. Cl.
CPC ............. *G02B 26/005* (2013.01); *G02B 1/06* (2013.01); *G03F 7/20* (2013.01); *G03F 7/30* (2013.01)

(58) Field of Classification Search
CPC G02B 26/005; G02B 1/06; G03F 7/30; G03F 7/20
(Continued)

(56) References Cited

U.S. PATENT DOCUMENTS 8,208,194 B2 * 6/2012 Mueller-Marc ...... G02B 26/004
345/107
2009/0168144 A1 7/2009 Lo et al.
(Continued)

FOREIGN PATENT DOCUMENTS

| CN | 103229098 A | 7/2013 |
|---|---|---|
| CN | 103270446 A | 8/2013 |
| KR | 20130091933 A | 8/2013 |

OTHER PUBLICATIONS

Dezhu Ma, Polymer Structure and Performance (Performance), pp. 227-228, Science Press, Mar. 2013, First Edition.
(Continued)

*Primary Examiner* — Jack Dinh
(74) *Attorney, Agent, or Firm* — Nath, Goldberg & Meyer; Joshua B. Goldberg

(57) ABSTRACT

The invention relates to the field of display technique, particularly relates to an electrowetting display panel, a fabrication method thereof and a display apparatus comprising the same. The electrowetting display panel comprises a first substrate and a second substrate which are disposed opposite to each other, wherein the first substrate, the second substrate and the space therebetween are divided into a plurality of sub-pixel areas, and a baffle wall is disposed in the gap area between each two adjacent sub-pixel areas, characterized in that the baffle wall is formed from a material having both a hydrophilic group and a hydrophobic group. The electrowetting display panel has a simpler structure, the baffle wall thereof has a superior adhesiveness, and there is no necessary to form a hole in the hydrophobic dielectric layer to enhance the adhesiveness of the baffle wall during fabrication, such that the fabrication process is simplified.

12 Claims, 4 Drawing Sheets

(51) Int. Cl.
*G03F 7/30* (2006.01)
*G03F 7/20* (2006.01)

(58) Field of Classification Search
USPC .................................................. 359/290, 295
See application file for complete search history.

(56) References Cited

U.S. PATENT DOCUMENTS

| | | |
|---|---|---|
| 2009/0191334 A1 | 7/2009 | Dai et al. |
| 2013/0021661 A1 | 1/2013 | Baek et al. |
| 2013/0222879 A1 | 8/2013 | Kuo et al. |
| 2014/0022622 A1 | 1/2014 | Park et al. |
| 2014/0036341 A1 | 2/2014 | Kwon et al. |

OTHER PUBLICATIONS

Chinese Office Action dated Nov. 4, 2015 issued in corresponding Chinese Application No. 201410211434.6.

\* cited by examiner

ELECTROWETTING DISPLAY PANEL, FABRICATION METHOD THEREOF AND DISPLAY APPARATUS COMPRISING THE SAME

FIELD OF THE INVENTION

The present invention relates to the field of display technique, particularly relates to an electrowetting display panel, a fabrication method thereof and a display apparatus comprising the same.

BACKGROUND OF THE INVENTION

Liquid crystal display has some defects including high energy consumption, low response speed, small visual angle, low color conversion ratio and low contrast, etc. due to its limitation in display principle. Thus, there is an urgency to develop a new display technique to provide better viewing experiences. The electrowetting display technique emerges as required, which is considered to be a new generation of display technique capable of replacing the liquid crystal display in the future because the electrowetting display possesses advantages of higher black/white reflectivity, high color conversion ratio, high contrast, large visual angle and fast response and so on.

The electrowetting display technique is a technique of inducing the change of pixel by controlling the flow direction of the surrounded liquid by virtue of controlling the change of voltage. In the electrowetting display panel, as shown in FIG. 1, a baffle wall 6 is disposed between a upper substrate 2 and a lower substrate 1 which are arranged opposite to each other, wherein an ink 7 is filled between each two adjacent baffle walls and a salt solution 8 is present between the upper substrate 2 and the ink 7. Currently, SU8 photoresist having hydrophilicity is generally used as the material for forming the baffle wall. In the electrowetting display panel, a hydrophilic underlying material 4 and a hydrophobic underlying material 5 are formed sequentially above a base 3 of the lower substrate 1. In order to form the baffle wall 6 and provide a good adhesiveness to the baffle wall 6, the currently conventional method for fabricating the electrowetting display panel includes the following steps: forming a hole in the hydrophobic underlying material 5 of the lower substrate 1 by using mask exposure and development processes; providing a SU8 photoresist having hydrophilicity in the hole so as to make the bottom of the baffle wall 6 to be formed on the hydrophilic underlying material 4, such that the adhesiveness between the baffle wall 6 and the hydrophilic material of the hydrophilic underlying material 4 is enhanced, which preventing the occurrence of stripping due to insufficient adhesion.

It can be seen that an additional pass of exposure and development has to be conducted in order to form a hole that makes the baffle wall having hydrophilicity directly contact the hydrophilic base, which doubtlessly increases the steps of the process for fabricating an electrowetting display panel and increases the complexity of the fabrication, and raises the fabrication cost accordingly.

SUMMARY OF THE INVENTION

In view of the foregoing defects existed in the prior art, the object of the present invention is to provide an electrowetting display panel and a fabrication method thereof, as well as a display apparatus comprising the electrowetting display panel. The electrowetting display panel has a simple structure, the baffle wall thereof has good adhesiveness, and there is no necessary to form a hole in the hydrophobic dielectric layer to enhance the adhesiveness of the baffle wall during fabrication, such that the fabrication process is simplified.

The object of the present invention is achieved by providing an electrowetting display panel comprising a first substrate and a second substrate which are disposed opposite to each other, wherein the first substrate, the second substrate and the space therebetween are divided into a plurality of sub-pixel areas, and a baffle wall is disposed in the gap area between each two adjacent sub-pixel areas, characterized in that the baffle wall is formed from a material having both a hydrophilic group and a hydrophobic group.

Preferably, the baffle wall is formed from a polymer comprising a hydrophobic main chain and a hydrophilic group pendant from the hydrophobic main chain.

Preferably, the baffle wall is formed from a copolymer comprising a hydrophobic perfluorinated main chain and a hydrophilic sulfonic acid group pendant from the hydrophobic perfluorinated main chain.

Preferably, the baffle wall is formed from a copolymer of tetrafluoroethylene and perfluoro-2-(sulfo ethoxy) propyl vinyl ether, wherein the copolymer comprises a hydrophobic perfluorinated main chain and a hydrophilic sulfonic acid group pendant from the perfluorinated main chain.

Preferably, the first substrate comprises a first electrode layer having hydrophilicity on the side facing the second substrate; the second substrate comprises, on the side facing the first substrate, a second electrode layer having hydrophilicity and a hydrophobic dielectric layer disposed on the side of the second electrode layer facing the first substrate; and the baffle wall is disposed between the hydrophobic dielectric layer and the first electrode layer; wherein the cavity formed between each two adjacent baffle walls is filled with a hydrophobic material; and the space between the first electrode layer and the hydrophobic material is filled with a hydrophilic solution.

Preferably, the first electrode layer is prepared from ITO material; the second electrode layer is prepared from ITO material; the hydrophobic dielectric layer is prepared from fluorine-containing polymer or resin material; the hydrophobic material comprises an ink; and the hydrophilic solution comprises a salt solution containing $K^+$ ions and/or $Na^+$ ions.

Preferably, the thickness of the baffle wall is smaller than the distance between the first substrate and the second substrate, and is in the range of 1-100 μm.

The present invention also provides a display apparatus comprising the electrowetting display panel according to the present invention.

The present invention also provides a method for fabricating the electrowetting display panel according to the present invention, comprising a step of forming a baffle wall in the gap area between each two adjacent sub-pixel areas, wherein the baffle wall is formed from a material having both a hydrophilic group and a hydrophobic group through a patterning process.

Preferably, the baffle wall is formed from a copolymer of tetrafluoroethylene and perfluoro-2-(sulfo ethoxy) propyl vinyl ether, wherein the copolymer comprises a hydrophobic perfluorinated main chain and a hydrophilic sulfonic acid group pendant from the hydrophobic perfluorinated main chain.

Preferably, the step of forming the baffle wall specifically comprises:

Step S1): forming a baffle wall film layer on the second substrate;

Step S2): drying the baffle wall film layer;

Step S3): forming a masking layer on the baffle wall film layer and exposing the baffle wall film layer with the masking layer to light, thereby forming a baffle wall pattern;

Step S4): developing the baffle wall film layer obtained from step S3) to form the baffle wall; and Step S5): removing the masking layer.

Preferably, the baffle wall film layer is formed by an ink-jet process and the thickness of the baffle wall film layer is in the range of 1-100 μm.

Preferably, ethanol is used for developing the baffle wall film layer obtained from step S3).

The advantageous effects of the present invention include: in the electrowetting display panel of the present invention, since the baffle wall is formed from a material having both a hydrophilic group and a hydrophobic group, for example, a perfluorinated sulfonic acid resin, directly on the hydrophobic dielectric layer, the baffle wall is sufficiently adhered to the hydrophobic dielectric layer because the baffle wall and the hydrophobic dielectric layer both have hydrophobicity, and thus the electrowetting display panel has a simpler structure. Furthermore, since the superior adhesiveness of the baffle wall in the electrowetting display panel is ensured, the electrowetting display panel is capably of ensuring a stable display effect.

Accordingly, in the fabrication method of the electrowetting display panel, the baffle wall of the electrowetting display panel is formed from a material having both a hydrophilic group and a hydrophobic group, for example, a perfluorinated sulfonic acid resin, through a patterning process. Since the material for forming the baffle wall contains both a hydrophilic group and a hydrophobic group, the hydrophobic group of the baffle wall can be effectively adhered to the hydrophobic dielectric layer of the second substrate due to the similarity and compatibility of molecules and the self-assembly of these molecules. Since the polarity of the hydrophobic group of the baffle wall is the same with that of the hydrophobic dielectric layer, the adhesion therebetween is relatively stronger. Compared with the prior art, a baffle wall with good adhesiveness can be obtained without forming a hole in the hydrophobic dielectric layer when forming the baffle wall. Therefore, one pass of exposure and development can be omitted and the whole process can be simplified and the cost can thus be decreased. Meanwhile, the hydrophilic group of the baffle wall is capably of contacting hydrophilic materials effectively, the requirement of the electrowetting display can thus be met.

Therefore, a display apparatus with a simpler structure, lower fabrication cost and more stable display effect can be obtained by using the electrowetting display panel of the present invention as described above.

DESCRIPTION OF THE FIGURES

FIGS. 4A to 4H are schematic views showing the fabrication process of the baffle wall of the fabrication method of the electrowetting display panel according to Example 2 of the present invention, wherein:

FIG. 4A is a schematic view showing the process of forming a baffle wall film layer on a second substrate;

FIG. 4B is a schematic view showing the arrangement of the molecular structure of the material for forming the baffle wall during the drying process;

FIG. 4C is a schematic view showing the process of forming a masking layer on the baffle wall film layer;

FIG. 4D is a schematic view showing the process of exposing the masking layer to light;

FIG. 4E is a sectional view showing the shape of the masking layer upon development;

FIG. 4F is a sectional view showing the shape of the baffle wall film layer upon development;

FIG. 4G is a sectional view showing the structure of the second substrate on which baffle walls are formed; and FIG. 4H is a vertical view showing the structure of the second substrate on which baffle walls are formed.

DETAILED DESCRIPTION OF CERTAIN EMBODIMENTS

Figure 1:
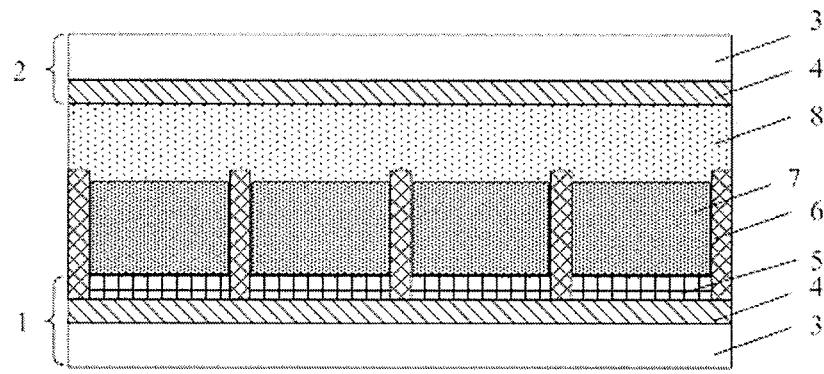
FIG. 1 is a sectional view showing the electrowetting display panel of the prior art.

The electrowetting display panel, the fabrication method thereof and the display apparatus according to the present invention will be further described below in details with reference to the accompanying drawings and specific embodiments in order to make the person skilled in the art better understand the technical solution of the present invention.

The present invention provides an electrowetting display panel comprising a first substrate and a second substrate which are disposed opposite to each other, wherein the first substrate, the second substrate and the space therebetween are divided into a plurality of sub-pixel areas, and a baffle wall is disposed in the gap area between each two adjacent sub-pixel areas, wherein the baffle wall is formed from a material having both a hydrophilic group and a hydrophobic group.

Preferably, the baffle wall is formed from a polymer comprising a hydrophobic main chain and a hydrophilic group pendant from the hydrophobic main chain.

More preferably, the baffle wall is formed from a copolymer comprising a hydrophobic perfluorinated main chain and a hydrophilic sulfonic acid group pendant from the hydrophobic perfluorinated main chain. Wherein, a preferable example of the copolymer is a copolymer of tetrafluoroethylene and perfluoro-2-(sulfo ethoxy) propyl vinyl ether, wherein the copolymer of tetrafluoroethylene, and perfluoro-2-(sulfo ethoxy) propyl vinyl ether comprises a hydrophobic perfluorinated main chain and a hydrophilic sulfonic acid group pendant from the perfluorinated main chain. The copolymer is commercially available, and may be, for example, the Nafion film from DuPont Company, USA.

In a specific embodiment of the electrowetting display panel according to the present invention, the first substrate comprises a first electrode layer having hydrophilicity on the side facing the second substrate, the second substrate comprises, on the side facing the first substrate, a second electrode layer having hydrophilicity and a hydrophobic dielectric layer disposed on the side of the second electrode layer facing the first substrate, and the baffle wall is disposed between the hydrophobic dielectric layer and the first electrode layer; wherein the cavity formed between each two adjacent baffle walls is filled with a hydrophobic material, and the space between the first electrode layer and the hydrophobic material is filled with a hydrophilic solution.

The first electrode layer, the second electrode layer, the hydrophobic dielectric layer, the hydrophobic material and the hydrophilic solution can be prepared by using any materials well known in the art. For example, the first electrode layer can be prepared from a hydrophilic ITO material; the second electrode layer can also be prepared from a hydrophilic ITO material; the hydrophobic dielectric layer can be prepared from fluorine-containing polymer or resin material; the hydrophobic material can comprise an ink; and the hydrophilic solution can comprise a salt solution containing $K^+$ ions and/or $Na^+$ ions.

In the present invention, the thickness of the baffle wall is generally smaller than the distance between the first substrate and the second substrate. For example, the thickness of the baffle all is in the range of 1-100 μm, and preferably in the range of 10-70 μm.

Taking the copolymer of tetrafluoroethylene and perfluoro-2-(sulfo ethoxy) propyl vinyl ether (i.e., the perfluorinated sulfonic acid resin) for example, the baffle wall is formed from the perfluorinated sulfonic acid resin which is hydrophilic at one end and is hydrophobic at the other end of the molecule. Therefore, the hydrophobic end of the baffle wall can be formed directly on the hydrophobic dielectric layer, and a sufficient adhesion therebetween can be ensured because the baffle wall and the hydrophobic dielectric layer are both hydrophobic. As a result, there is no necessary to form holes in the hydrophobic dielectric layer as it is done in the structure of the electrowetting display panel in the prior art to achieve good contact and adhesion between the baffle wall and the second substrate. Moreover, the hydrophilic end of the baffle wall tends to expose in hydrophilic materials, such that the requirements that the bottom of the baffle wall has hydrophobicity and that the top of the baffle wall has hydrophilicity in the electrowetting display panel can be met simultaneously, and thus the requirement of electrowetting display can be satisfied. Since there is no need to form a hole in the hydrophobic dielectric layer, the structure of the electrowetting display panel is simpler and one pass of exposure and development during the formation of the baffle wall can be omitted. Therefore, the whole process can be simplified and the cost can be decreased accordingly.

The present invention also provides a display apparatus, comprising the electrowetting display panel according to the present invention.

The present invention also provides a method for fabricating the electrowetting display panel as described above, comprising a step of forming a baffle wall in the gap area between each two adjacent sub-pixel areas, wherein the baffle wall is formed from a material having both a hydrophilic group and a hydrophobic group through a patterning process.

It should be understood that in the present invention, the patterning process can merely include a photoetching process, or can include a photoetching process and an etching step, or can also include other processes used for forming a pre-determined pattern, such as a printing process, an ink-jet process and so on. The photoetching process refers to a process for forming a pattern by using a photoresist, a mask plate, an exposure machine, etc., which comprises the steps of film-forming, exposure, development, etc. The patterning process can be selected suitably according to the structure to be formed in the invention. A person skilled in the art should understand that the patterning processes as described above are all well known in the art and can be performed in a conventional manner in the art.

The step of forming the baffle wall comprises:
Step S1): forming a baffle wall film layer on the second substrate;
Step S2): drying the baffle wall film layer;
Step S3): forming a masking layer on the baffle wall film layer and exposing the baffle wall film layer with the masking layer to light, thereby forming a baffle wall pattern;
Step S4): developing the baffle wall film layer obtained from step S3) to form the baffle wall; and
Step S5): removing the masking layer.

The process and condition in each of the above steps according to the method of the present invention can be performed in accordance with those conventionally used in the art.

Preferably, the baffle wall film layer is formed by an ink-jet process and the thickness of the baffle wall film layer is in the range of 1-100 μm.

Further preferably, ethanol can be used for developing the baffle wall film layer when the perfluorinated sulfonic acid resin liquid is used to form the baffle wall film layer. As such, the baffle wall film layer can be developed by using the ethanol instead of the traditional acid solution. Adopting ethanol as a developer not only facilitates the obtaining of the materials used, simplifies the fabrication process, reduces the price and saves the cost, but also decreases the pollution to the environment. Preferably, the ethanol can be an aqueous solution with a concentration of 60-99.99% (v/v).

In a specific embodiment of the present invention, the display of the electrowetting display panel is realized by controlling the flow directions of the hydrophilic liquid and the hydrophobic liquid enclosed inside the electrowetting display panel by virtue of controlling the change of the voltage.

Generally, the structure of the electrowetting display panel mainly comprises a plurality of electrowetting display pixel structures, wherein each electrowetting display pixel structure comprises a pixel electrode, a hydrophobic dielectric layer, an oily flowable medium (i.e., the hydrophobic material filled within the cavity formed by the baffle walls), an aqueous flowable medium (i.e., the hydrophilic solution) and a baffle wall. The hydrophobic dielectric layer is arranged above the pixel electrode and the baffle wall is arranged on the hydrophobic dielectric layer, wherein the oily flowable medium is arranged on the surface of the hydrophobic dielectric layer and the aqueous flowable medium covers the oily flowable medium.

Figure 2:
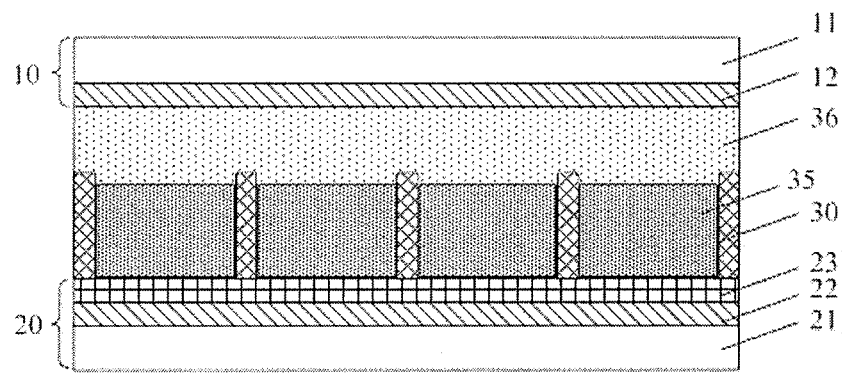
FIG. 2 is a sectional view showing the electrowetting display panel according to Example 1 of the present invention.
Figure 4A:
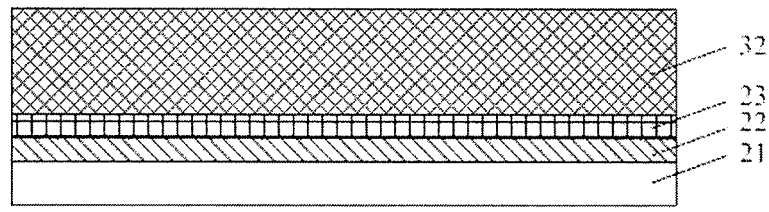

As shown in FIG. 2, in this embodiment, the electrowetting display panel comprises a first substrate 10 and a second substrate 20 which are disposed opposite to each other, wherein the first substrate 10, the second substrate 20 and the space therebetween are divided into a plurality of sub-pixel areas. A baffle wall 30 is disposed in the gap area between each two adjacent sub-pixel areas, and the baffle wall 30 is formed from a material having both a hydrophilic group and a hydrophobic group. As shown in FIG. 4H, the baffle walls 30 are arranged in form of an array between the first substrate 10 and the second substrate 20, the sub-pixel areas 31 are formed by the jointed baffle walls 30, and the electrowetting display pixel structures are formed within the sub-pixel areas 31.

Wherein, in FIG. 2, the first substrate 10 comprises a first base 11 and a first electrode layer 12 having hydrophilicity disposed on the side of the first base 11 facing the second substrate 20. The second substrate 20 comprises a second base 21, a second electrode layer 22 having hydrophilicity disposed on the side of the second base 21 facing the first substrate 10 and a hydrophobic dielectric layer 23 closer to the first substrate 10 relative to the second electrode layer 22, wherein the hydrophobic dielectric layer 23 has the following three functions; planarization, being used as a dielectric layer and decreasing surface energy. The baffle wall 30 is disposed between the hydrophobic dielectric layer 23 and the first electrode layer 12, i.e., disposed above the hydrophobic dielectric layer 23 as shown in FIG. 2. The cavity formed between each two adjacent baffle walls 30 is filled with a hydrophobic material, and the space between the first electrode layer 12 and the hydrophobic material is filled with a hydrophilic solution.

In this embodiment, the first base 11 and the second base 21 can be prepared from transparent glass, wherein the second base 21 is generally used as a carrier for forming an electrode and a fluid cavity (i.e., the cavity formed by the baffle walls, which contain the oily flowable medium and part of the aqueous flowable medium), and the first base 11 is generally used as a carrier for forming an electrode and is used for encapsulating the flowable medium in the fluid cavity. The first electrode layer 12 is the common electrode, the second electrode layer 22 is the pixel electrode, the oily flowable medium is the hydrophobic liquid such as an ink 35, and the aqueous flowable medium is the hydrophilic solution such as a salt solution 36 containing $K^+$ ions and/or $Na^+$ ions.

In order to achieve good electrowetting display effect, the first electrode layer 12 can be prepared from ITO (Indium Tin Oxide) material and the thickness thereof can be in the range of 800 Å to 6000 Å, and the second electrode layer 22 can also be prepared from ITO (Indium Tin Oxide) material and the thickness thereof can be in the range of 800 Å to 6000 Å. The hydrophobic dielectric layer 23 can be prepared from a fluorine-containing polymer or resin material, the hydrophobic material can be an ink, and the hydrophilic solution can be a salt solution containing $K^+$ ions and/or $Na^+$ ions. The display can be realized by applying current between the first electrode 12 and the second electrode 22 to generate electric field and thereby the flow directions of the hydrophobic liquid (i.e., the ink 35) and the hydrophilic solution (i.e., the salt solution 36) are changed.

Figure 3:
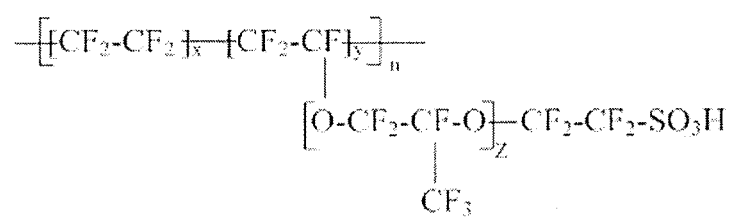
FIG. 3 is a chemical formula representing one material for forming the baffle wall of the present invention.

Preferably, the baffle wall 30 is formed from a perfluorinated sulfonic acid resin under the trade name of Nafion film available from DuPont Company, USA, which is a copolymer copolymerized from tetrafluoroethylene and perfluoro-2-(sulfo ethoxy) propyl vinyl ether, wherein the copolymer comprises a hydrophobic perfluorinated main chain and a hydrophilic sulfonic acid group pendent from the perfluorinated main chain. As shown in FIG. 3, the copolymer of tetrafluoroethylene and perfluoro-2-(sulfo ethoxy) propyl vinylether can be represented by the following molecular formula:

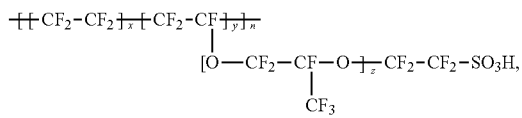

wherein x=6 or 7, y is any integer of from 1 to 10, z=1, 2 or 3, and n=800-1500, preferably 1000.

Figure 4B:
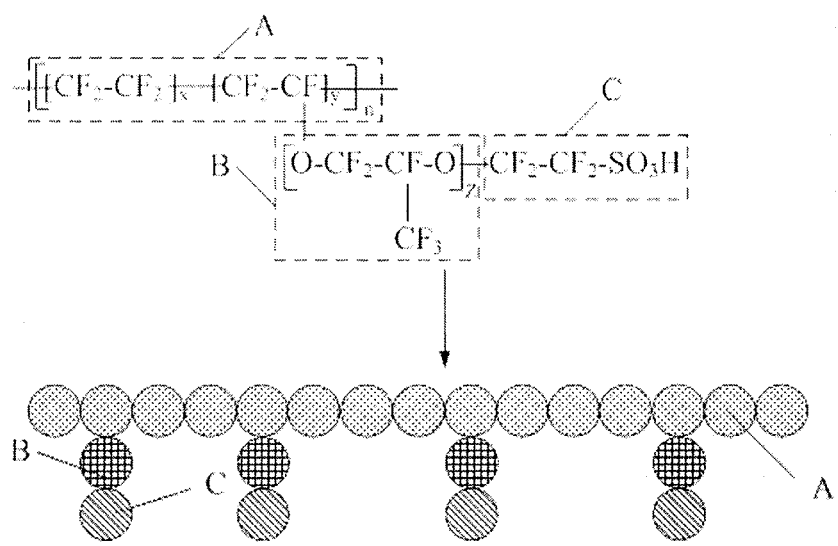

As shown in FIG. 4B, during the formation of the baffle wall 30, the hydrophilic groups and the hydrophobic groups of the perfluorinated sulfonic acid resin arrange regularly, that is to say, in the molecular formula of the copolymer of tetrafluoroethylene and perfluoro-2-(sulfo ethoxy) propyl vinyl ether, the hydrophobic perfluorinated main chain A and the hydrophilic sulfonic acid group C and the propyl vinyl ether group B pendent from the perfluorinated main chain form a regular arrangement. In this case, the hydrophobic end of the baffle wall 30 is formed on the hydrophobic dielectric layer 23 having hydrophobicity. Since the hydrophobic and and the hydrophobic dielectric layer 23 are both hydrophobic, a sufficient adhesion can be obtained therebetween.

The baffle wall 30 is transparent and serves as a barrier which only allows the passage of cations, but not the passage of electrons, anions and molecules. That is, the baffle wall prepared from the perfluorinated sulfonic acid resin forms a molecular sieve that can be used for filtering or baffling part of the undesired ions or molecules and allowing the passage of desired ions. The ink, which is a kind of molecule, between each two adjacent sub-pixel areas would not pass through the baffle wall to contact each other because the barrier like character of the baffle wall to the undesired molecules.

In this embodiment, the thickness of the baffle wall 30 is smaller than the distance between the first substrate 10 and the second substrate 20, that is, the baffle wall 30 is disposed on the second substrate 20 with a certain distance away from the first substrate 10. Preferably, the thickness of the baffle wall 30 is in the range of 1-100 μm.

In this embodiment, the electrowetting display panel is fabricated through the following process using the second substrate 20 on which the baffle wall 30 has been formed. First, the second substrate 20 on which the baffle wall 30 has been formed is immersed in an ink until it is totally soaked, then it is taken out. Next, thus obtained second substrate 20 is placed in a salt solution containing $Na^+$ ions and/or $K^+$ ions. After the salt solution planarizes the surface of the ink, the ink 35 and the salt solution 36 having the shapes as shown in FIG. 2 are formed. Finally, the first substrate 10 is placed in the salt solution and encapsulated together with the second substrate 20. After encapsulation, the hydrophobic end of the baffle wall 30 is adhered to the hydrophobic dielectric layer 23 and the hydrophilic end thereof is exposed in the salt solution 36, such that the requirement that the bottom of the baffle wall is hydrophobic while the top of the baffle wall is hydrophilic in the electrowetting display panel can be met.

In a specific embodiment according to the method for fabricating the electrowetting display panel of the present invention, the method comprises the step of forming a baffle wall in the gap area between each two adjacent sub-pixel areas, wherein the baffle wall is formed from a copolymer of tetrafluoroethylene and perfluoro-2-(sulfo ethoxy) propyl vinyl ether which contains a hydrophobic perfluorinated main chain and a hydrophilic sulfonic acid group pendent from the perfluorinated main chain.

In the present embodiment, the step of forming the baffle wall specifically comprises:

Step S1): forming a baffle wall film layer on the second substrate.

In this step, a baffle wall film layer 32 is formed on the second substrate 20 through an ink-jet process, and the thickness of the baffle wall film layer 32 is in the range of 1-100 μm. Particularly, the perfluorinated sulfonic acid resin liquid is sputtered onto the hydrophobic dielectric layer 23 by an ink-jet process to form the baffle wall film layer 32, as shown in FIG. 4A, wherein the hydrophobic dielectric layer 23 has hydrophobicity while the second electrode layer 22 has hydrophilicity.

Step S2): drying the baffle wall film layer.

In this step, the baffle wall film layer 32 is dried at a temperature in the range of 5-120° C. During the drying process, since the perfluorinated sulfonic acid resin molecule comprises a hydrophobic perfluorinated main chain and a hydrophilic sulfonic acid group pendent from the perfluorinated main chain, the hydrophobic perfluorinated main chain has good adhesiveness to the hydrophobic dielectric layer 23 and the hydrophilic sulfonic acid group pendent from the perfluorinated chain exhibits a good compatibility with the salt solution encapsulated between the first substrate 10 and the second substrate 20 in the electrowetting display panel, thereby satisfying the requirement of the electrowetting baffle wall.

In particular, since the perfluorinated sulfonic acid resin molecule has both a hydrophobic side and a hydrophilic side, the polar hydrophobic side and the hydrophobic dielectric layer 23 of the second substrate 20 will arrange orderly under the molecular force due to the similarity and compatibility of molecules and the self-assembly of these molecules during the drying process, which causes the hydrophobic dielectric layer 23 to contact the hydrophobic side of the perfluorinated sulfonic acid resin molecule while to repulse the non-polar hydrophilic side. Therefore, the hydrophobic groups of the perfluorinated sulfonic acid resin molecule can be adhered effectively to the hydrophobic dielectric layer 23, such that an arrangement as shown in FIG. 4B can be formed. Particularly, in the perfluorinated sulfonic acid resin liquid for forming the baffle wall 30, the hydrophobic perfluorinated main chain A, and the hydrophilic sulfonic acid group C and the propyl vinyl ether group B pendent from the perfluorinated chain in the molecular formula of the copolymer of tetrafluoroethylene and perfluoro-2-(sulfo ethoxy) propyl vinyl ether form a regular arrangement.

In brief, the principle of similarity and compatibility refers to such a phenomenon that the molecules having the same polarity tend to aggregate to one side due to the electric property of polar molecules. For example, a solute composed of polar molecules is easily dissolved in a solvent composed of polar molecules while is hardly dissolved in a solvent composed of non-polar molecules; and a solute composed of non-polar molecules is easily dissolved in a solvent composed of non-polar molecules while is hardly dissolved in a solvent composed of polar molecules. The self-assembly phenomenon refers to such a phenomenon that the constituted elements, for example, the molecules in a system aggregate together and form a organized structure spontaneously without any artificial external force.

Step S3): forming a masking layer on the baffle wall film layer and exposing the baffle wall film layer with the masking layer to light, thereby forming a baffle wall pattern.

Figure 4C:
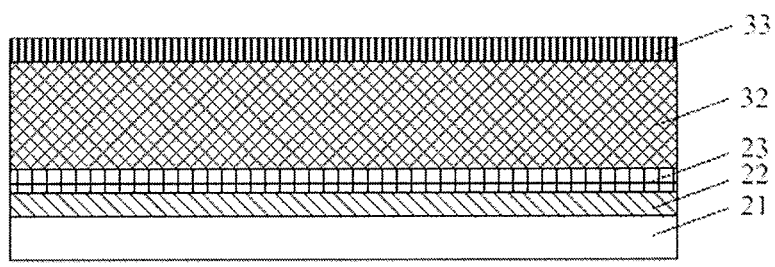

This step specifically comprises:

Step S31): forming a masking layer 33 with a thickness in the range of 1-10 μm on the baffle wall film layer 32 by a spin-coating process, as shown in FIG. 4C. In this step, the masking layer 33 is prepared from a photoresist, that is to say, a layer of photoresist is formed on the baffle wall film layer 32. During the spin-coating process to form the masking layer 33, the rotation speed of the spin coater can be adjusted to the range of 100-4000 r/minute (rpm), and the duration can be adjusted to the range of 5-100 seconds (s). This embodiment is described by taking a positive photoresist for forming the masking layer 33 as an example.

Step S32): pre-baking the masking layer 33 at a temperature in the range of 5-120° C. to remove the moisture in the photoresist for forming the masking layer.

Figure 4D:
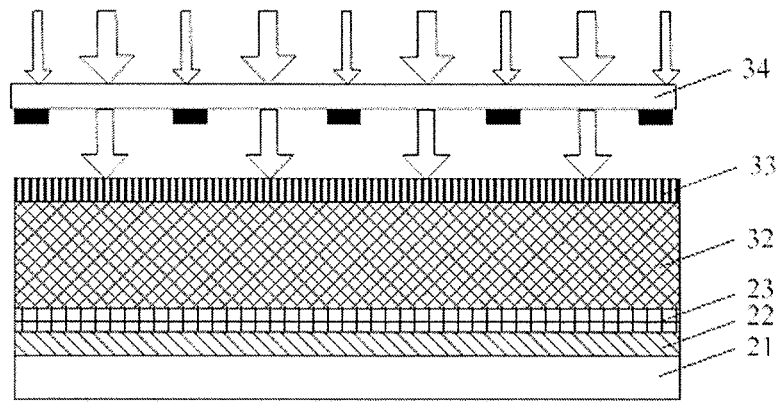

Step S33): exposing the masking layer 33 to light as shown in FIG. 4D. This step is described by taking the positive photoresist as an example. The masking layer 33 is exposed to light by using a mask plate 34, and when the light passes through the mask plate 34, the part of the masking layer 33 corresponding to the portion without being masked by the black mask pattern is exposed and a photochemical reaction is occurred, while the portion masked by the black mask pattern does not involve a photochemical reaction.

Figure 4E:
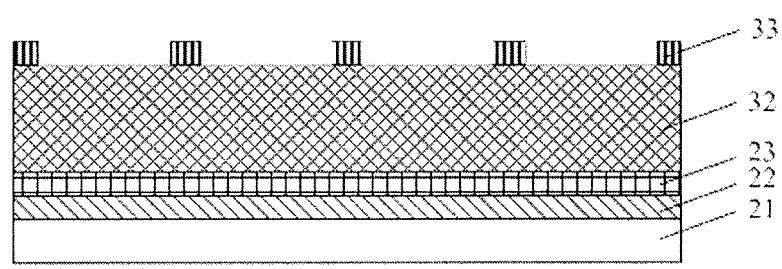

Step S34): developing the masking layer 33 at a temperature of 5-50° C. In this step, the exposed portion of the masking layer 33 is removed by being dissolved in a developer while the unexposed portion is remained due to its indissolubility in the developer; thereby a baffle wall pattern is formed from the masking layer 33. The masking layer 33 subjected to the development process can be referred to FIG. 4E.

Step S4): developing the baffle wall film layer obtained from step S3) to form the baffle wall.

Figure 4F:
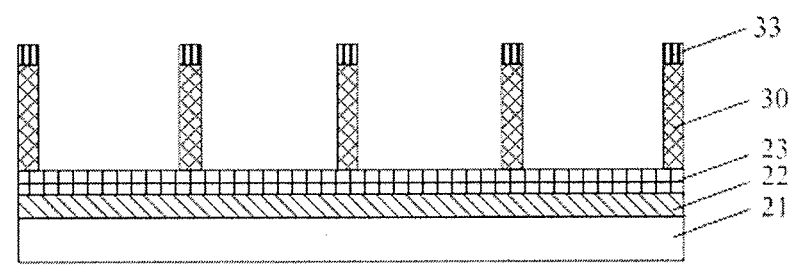

In this step, an ethanol solution is used for developing the obtained baffle wall film layer 32, upon which the baffle wall film layer 32 forms a patterned baffle wall 30, as shown in FIG. 4F. Since the baffle wall film layer 32 formed from the perfluorinated sulfonic acid resin liquid can be dissolved in the ethanol solution, it can be developed by using the ethanol instead of the traditional acid solution. Adopting ethanol as a developer not only facilitates the obtaining of the materials used, simplifies the fabrication process, reduces the price and saves the cost, but also decreases the pollution to the environment.

Step S5): removing the masking layer.

Figure 4G:
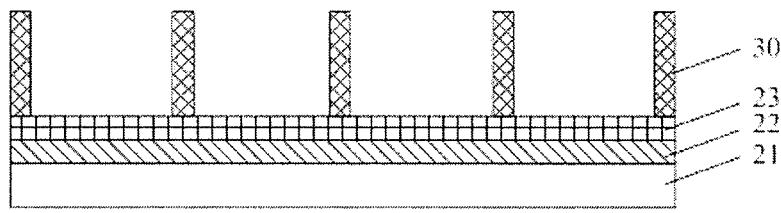
Figure 4H:
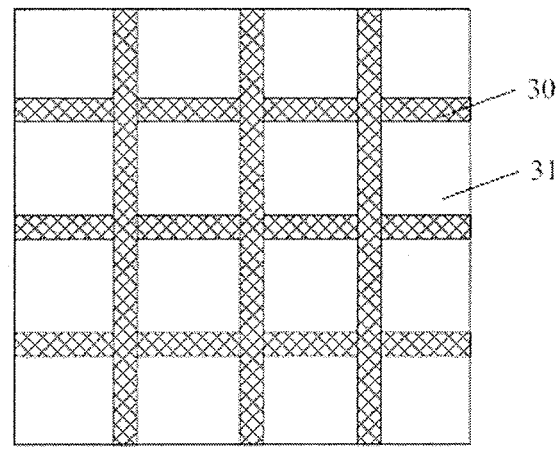

In this step, the masking layer 33 is removed by a stripping process or other processes, as shown in the sectional view in FIG. 4G and the vertical view in FIG. 4H. Then the second substrate 20 on which the baffle wall 30 has been formed is washed.

In the method for fabricating the electrowetting display panel according to the present embodiment, the baffle wall of the electrowetting display panel is formed from the perfluorinated sulfonic acid resin liquid through a patterning process. Since the perfluorinated sulfonic acid resin molecule contains both a hydrophilic group and a hydrophobic group, the hydrophobic group of the molecule can be effectively adhered to the hydrophobic dielectric layer of the second substrate due to the similarity and compatibility of molecules and the self-assembly of these molecules. Since the polarity of said hydrophobic group is the same with that of the hydrophobic dielectric layer, the adhesion therebetween is relatively stronger. Compared with the prior art, a baffle wall with good adhesiveness can be obtained without forming a hole in the hydrophobic dielectric layer when forming the baffle wall. Therefore, one pass of exposure and development can be omitted and the whole process can be simplified and the cost can thus be decreased. Meanwhile, the hydrophilic group of the perfluorinated sulfonic acid resin molecule is capably of contacting hydrophilic materials effectively, the requirement of the electrowetting display can thus be met.

Another specific embodiment of the present invention provides a display apparatus, which comprises, for example, the electrowetting display panel as described in the above specific embodiment, wherein the baffle wall is prepared by using the method for fabricating the electrowetting display panel according to the above specific embodiment.

The display apparatus can be any product or component having display function, such as electronic paper, mobile phone, tablet PC, television, displayer, laptop, digital photo frame, navigator, etc. The method and process for fabricating the display apparatus can be any method and process that are generally used in the art.

The display apparatus of the present embodiment has a simpler structure and the fabrication cost thereof is much lower because the electrowetting display panel and the fabrication method thereof according to the present invention are applied. Furthermore, since the superior adhesiveness of the baffle wall in the electrowetting display panel is ensured, the electrowetting display panel is capably of ensuring a stable display effect.

As used in this specification and the appended claims, the words "a", "an", and "the", or cases not indicating quantity, include plural referents unless the content clearly dictates otherwise. Thus, for example, reference to a composition containing "a compound" includes a mixture of two or more compounds. As used in this specification and the appended claims, the term "or" is generally employed in its sense including "and/or" unless the content clearly indicates otherwise.

EXAMPLES

The examples below further illustrate the advantages and embodiments of the present invention, but the specific materials and the amounts thereof as well as other conditions and details as mentioned in the examples should not be interpreted to limit the protection scope of the present invention.

Example 1: Fabrication of the Electrowetting Display Panel

In this example, the electrowetting display panel comprises a first substrate and a second substrate which are disposed opposite to each other, wherein the first substrate comprises a first base and a first electrode layer having hydrophilicity disposed on the side of the first base close to the second substrate, and the second substrate comprises a second base, a second electrode layer having hydrophilicity disposed on the side of the second base close to the first substrate and a hydrophobic dielectric layer closer to the first substrate relative to the second electrode layer. The baffle wall is disposed on the hydrophobic dielectric layer. The cavity formed between each two adjacent baffle walls is filled with a hydrophobic material, and the space between the first electrode layer and the hydrophobic material is filled with a hydrophilic solution. The schematic structure of the electrowetting display panel is shown in FIG. 2.

The first base and the second base were both prepared from transparent glass available from Corning Company; the first electrode layer and the second electrode layer had a thickness of 1500 Å, respectively, and were both prepared from ITO material available from DongJin M.P. Tech Co., Ltd, Korea; the hydrophobic dielectric layer had a thickness of 1.7 μm and was prepared from Teflon AF1601 available from Dupont Company, which is an amorphous fluorine-containing compound comprising 4,5-difluoro-2,2-bis(trichloromethyl)-1,3-dioxole (PDD) and tetrafluoroethylene (TFE) as the main components; the hydrophobic material was an ink available from Plextronics Company; the hydrophilic solution was 1 mol/L KCl available from Dupont Company; and the baffle wall was formed from the copolymer of tetrafluoroethylene and perfluoro-2-(sulfo ethoxy) propyl vinyl ether (hereafter refers to "perfluorinated sulfonic acid resin") available from Dupont Company, which has the following molecular formula:

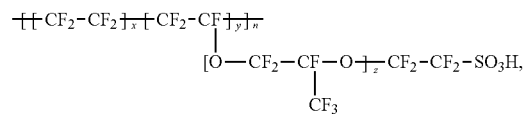

wherein x=6, y=6, z=2 and n=1000.

The electrowetting display panel can be fabricated in accordance with the conventional process and conditions in the art except for the process of forming a baffle wall on the hydrophobic dielectric layer. Specifically, 3-15 pillars for supporting the cell and defining its thickness were formed on one of the substrates by the exposure and development process, and then the baffle wall was formed as the method described below. The ink material was dropped into the cavity by a printing or sputtering process after the baffle wall was formed, and the substrate containing the ink was placed in a KCl solution. Then a UV sealant was coated onto the periphery of the substrate in the KCl solution, and another substrate was placed in the solution and the two substrates were aligned. Subsequently, the sealant was cured by an irradiation with UV light, and finally the aligned device was taken out from the solution.

The specific steps for forming the baffle wall on the hydrophobic dielectric layer were as follows:

Step S1): forming a baffle wall film layer on the hydrophobic dielectric layer.

A baffle wall film layer was formed by sputtering a perfluorinated sulfonic acid resin liquid (available from Dupont Company) onto the hydrophobic dielectric layer by using an ink-jet pen through an ink-jet process at atmospheric temperature and pressure.

Step S2): drying the baffle wall film layer.

The baffle wall film layer was dried at 95° C.

Step S3): forming a masking layer on the baffle wall film layer and exposing the baffle wall film layer with the masking layer to light, thereby forming a baffle wall pattern.

This step particularly comprises:

Step S31): forming a masking layer with a thickness of 1.7 μm on the baffle wall film layer by a spin-coating process. In this step, the masking layer was prepared from a photoresist resin (available from DongJin M.P. Tech Co., Ltd), i.e., a layer of photoresist was formed on the baffle wall film layer. During the spin-coating process to form the masking layer, the rotation speed of the spin coater was adjusted to 400 rpm, and the duration was adjusted to 5 s.

Step S32): pre-baking the masking layer at a temperature of 95° C. to remove the moisture in the photoresist for forming the masking layer.

Step S33): exposing the masking layer to light. In this step, a mask plate with a mask pattern (available from DongJin M.P. Tech Co., Ltd) was disposed on the masking layer which was then exposed at 200 mJ. When the light passed through the mask plate, the part of the masking layer corresponding to the portion without being masked by mask pattern was exposed and a photochemical reaction was occurred, while the portion masked by the mask pattern did not involve a photochemical reaction.

Step S34): developing the masking layer at a development temperature of 25° C. In this step, the exposed portion of the masking layer was removed by being dissolved in a developer (available from DongJin M.P. Tech Co., Ltd) while the unexposed portion was remained due to its indissolubility in the developer, thereby a pattern covering the baffle wall was formed from the masking layer.

Step S4): developing the baffle wall layer obtained from step S3) to form the baffle wall.

In this step, a 75% (v/v) ethanol solution was used for developing the obtained baffle wall film layer, upon which the baffle wall film layer formed a patterned baffle wall, as shown in FIG. 4F.

Step S5): removing the masking layer.

In this step, the masking layer was removed by using a stripping process. Specifically, the masking layer was stripped by being washed in an etching liquid (available from DongJin M.P. Tech Co., Ltd) at 50° C. for 3 min, and then the second substrate on which the baffle wall had been formed was washed.

Test Example

The electrowetting display panel fabricated in the present invention was observed with an optical microscope and no stripping of the baffle wall from the hydrophobic dielectric layer was observed.

It should be understood that the embodiments described above are merely the exemplary embodiments for the purpose of illustrating the principles of the present invention, which shall not limit the scope of the invention. Various changes and modifications to the present invention made without departing from the scope and spirit of invention by a person skilled in the art should all be covered in the protection scope of the present invention.

The invention claimed is:

1. An electrowetting display panel comprising a first substrate and a second substrate which are disposed opposite to each other, wherein the first substrate, the second substrate and the space therebetween are divided into a plurality of sub-pixel areas, and a baffle wall is disposed in the gap area between each two adjacent sub-pixel areas, characterized in that the second substrate comprises a hydrophobic dielectric layer disposed on the side of the second substrate facing the first substrate; the baffle wall is disposed on the surface of the hydrophobic dielectric layer facing the first substrate and formed from a polymer material comprising a hydrophobic main chain and a hydrophilic group pendent from the hydrophobic main chain directly on the hydrophobic dielectric layer.

2. The electrowetting display panel according to claim 1, characterized in that the baffle wall is formed from a copolymer comprising a hydrophobic perfluorinated main chain and a hydrophilic sulfonic acid group pendent from the hydrophobic perfluorinated main chain.

3. The electrowetting display panel according to claim 1, characterized in that the baffle wall is formed from a copolymer of tetrafluoroethylene and perfluoro-2-(sulfo ethoxy) propyl vinyl ether, wherein the copolymer comprises a hydrophobic perfluorinated main chain and a hydrophilic sulfonic acid group pendent from the perfluorinated main chain.

4. The electrowetting display panel according to claim 1, characterized in that the first substrate comprises a first electrode layer having hydrophilicity on the side facing the second substrate; the second substrate comprises, on the side facing the first substrate, a second electrode layer having hydrophilicity and the hydrophobic dielectric layer disposed on the side of the second electrode layer facing the first substrate; and the baffle wall is disposed between the hydrophobic dielectric layer and the first electrode layer; wherein the cavity formed between each two adjacent baffle walls is filled with a hydrophobic material, and the space between the first electrode layer and the hydrophobic material is filled with a hydrophilic solution.

5. The electrowetting display panel according to claim 4, characterized in that the first electrode layer is prepared from ITO material, the second electrode layer is prepared from ITO material, the hydrophobic dielectric layer is prepared from a fluorine-containing polymer or resin material; the hydrophobic material comprises an ink, and the hydrophilic solution comprises a salt solution containing $K^+$ ions and/or $Na^+$ ions.

6. The electrowetting display panel according to claim 4, characterized in that the thickness of the baffle wall is smaller than the distance between the first substrate and the second substrate, and is in the range of 1-100 μm.

7. A display apparatus comprising an electrowetting display panel comprising a first substrate and a second substrate which are disposed opposite to each other, wherein the first substrate, the second substrate and the space therebetween are divided into a plurality of sub-pixel areas, and a baffle wall is disposed in the gap area between each two adjacent sub-pixel areas, characterized in that the second substrate comprises a hydrophobic dielectric layer disposed on the side of the second substrate facing the first substrate; the baffle wall is disposed on the surface of the hydrophobic dielectric layer facing the first substrate and formed from a polymer material comprising a hydrophobic main chain and a hydrophobic group pendent from the hydrophobic main chain directly on the hydrophobic dielectric layer.

8. A method for fabricating an electrowetting display panel comprising a first substrate and a second substrate which are disposed opposite to each other, wherein the first substrate, the second substrate and the space therebetween are divided into a plurality of sub-pixel areas, the method comprising a step of forming a baffle wall in the gap area between each two adjacent sub-pixel areas, characterized in that the second substrate comprises a hydrophobic dielectric layer disposed on the side of the second substrate facing the first substrate; the baffle wall is disposed on the surface of the hydrophobic dielectric layer facing the first substrate and formed from a polymer material comprising a hydrophobic main chain and a hydrophilic group pendent from the hydrophobic main chain directly on the hydrophobic dielectric layer.

9. The method according to claim 8, characterized in that the baffle wall is formed from a copolymer of tetrafluoroethylene and perfluoro-2-(sulfo ethoxy) propyl vinyl ether, wherein the copolymer comprises a hydrophobic perfluorinated main chain and a hydrophilic sulfonic acid group pendent from the perfluorinated main chain.

10. The method according to claim 8, characterized in that the step of forming the baffle wall comprises:
   Step S1): forming a baffle wall film layer on the second substrate;
   Step S2): drying the baffle wall film layer;
   Step S3): forming a masking layer on the baffle wall film layer and exposing the baffle wall film layer with the masking layer to light, thereby forming a baffle wall pattern;
   Step S4): developing the baffle wall film layer obtained from step S3) to form the baffle wall; and
   Step S5): removing the masking layer.

11. The method according to claim 10, characterized in that the baffle wall film layer is formed by an ink-jet process and the thickness of the baffle wall film layer is in the range of 1-100 μm.

12. The method according to claim 10, characterized in that ethanol is used for developing the baffle wall film layer obtained from step S3).

* * * * *